(12) United States Patent
Vaculik et al.

(10) Patent No.: US 10,495,675 B2
(45) Date of Patent: Dec. 3, 2019

(54) ELECTRIC POWER METER

(71) Applicants: Lukas Vaculik, Valasske Mezirci (CZ); Radomir Kozub, Ostrava Poruba (CZ); Martin Mienkina, Bystrice (CZ); Ludek Slosarcik, Ostrava-Bartovice (CZ)

(72) Inventors: Lukas Vaculik, Valasske Mezirci (CZ); Radomir Kozub, Ostrava Poruba (CZ); Martin Mienkina, Bystrice (CZ); Ludek Slosarcik, Ostrava-Bartovice (CZ)

(73) Assignee: NXP USA, Inc., Austin, TX (US)

( * ) Notice: Subject to any disclaimer, the term of this patent is extended or adjusted under 35 U.S.C. 154(b) by 425 days.

(21) Appl. No.: 14/471,107

(22) Filed: Aug. 28, 2014

(65) Prior Publication Data

US 2016/0061870 A1    Mar. 3, 2016

(51) Int. Cl.
*G01R 21/14* (2006.01)
*G01R 21/06* (2006.01)
*G01R 21/133* (2006.01)

(52) U.S. Cl.
CPC .............. *G01R 21/14* (2013.01); *G01R 21/06* (2013.01); *G01R 21/133* (2013.01)

(58) Field of Classification Search
CPC ....... G01R 21/14; G01R 21/06; G01R 21/133
USPC ........................................................ 324/142
See application file for complete search history.

(56) References Cited

U.S. PATENT DOCUMENTS

| | | | |
|---|---|---|---|
| 5,061,890 A | 10/1991 | Longini | |
| 5,508,617 A | 4/1996 | Komatsu | |
| 5,517,106 A * | 5/1996 | Longini | G01R 21/133 324/103 R |
| 6,735,535 B1 * | 5/2004 | Kagan | G01R 21/133 324/142 |
| 7,212,931 B2 | 5/2007 | Bierl | |
| 8,014,964 B1 | 9/2011 | Khalsa | |

OTHER PUBLICATIONS

Cambridge Consultants, "UMI (Universal Metering Interface)"; Cambridge Consultants Ltd.; eSmart-M-004 v1.1.doc; Jul. 3, 2009; 9 pages.
Freescale Semiconductor, Inc., "Electronic Tamper Detection Smart Meter Reference Design"; Overview; Freescale Semiconductor, Inc.; Tampermtrfs Rev 0; 2012; 2 pages.
Tam, K., "Current-Transformer Phase-Shift Compensation and Calibration"; Application Report; Texas Instruments; SLAA122; Feb. 2001; 7 pages.

* cited by examiner

*Primary Examiner* — Reena Aurora

(57) ABSTRACT

An electric power meter for measuring electric power is provided. The power meter has a frequency domain converter arranged to convert a sequence of digital voltage samples from the time domain to a frequency domain obtaining digital voltage frequency components, and to convert a sequence of digital current samples from the time domain to the frequency domain obtaining digital current frequency components. The electric power meter also has a frequency domain correction unit arranged to correct the voltage frequency components and the current frequency components by multiplying at least one frequency component of the current frequency components and the voltage frequency components with a complex correction factor using a complex multiplication unit. Electric power is computed by an energy calculation unit.

20 Claims, 9 Drawing Sheets

ELECTRIC POWER METER

FIELD OF THE INVENTION

This invention relates to an electric power meter, an integrated circuit, an electric power metering method, a computer program.

BACKGROUND OF THE INVENTION

U.S. Pat. No. 7,212,931 B2 discloses a known electric energy meter.

The known energy meter has two input terminals for connecting to an AC mains and two output terminals to which a load may be connected. A live line connects one of the input terminals to one of the output terminals. A neutral line directly connects the other ones of the input and output terminals.

Current is measured by installing a primary conductor of a DC tolerant current transformer in the live line. Terminals of a secondary winding of the current transformer are connected to each other via a resistor and to current detection ports of an integrated circuit. A secondary voltage induced in the secondary winding by a current flowing through the load is also present at the current detection ports of the integrated circuit.

Voltage is measured by mounting resistors in series so as to form a voltage divider between the live and neutral lines. The integrated circuit has voltage-measuring ports one of which is connected to an intermediate point between resistors of the voltage divider and the other is connected to the neutral line.

The measured current has a phase shift with respect to the measured voltage. In order to obtain a correct measurement of the energy consumption of the load, this phase shift must be taken account of in the integrated circuit.

The integrated circuit includes an analog-digital-converter and a microcomputer. The analog-digital converter operates at a frequency far in excess of the nominal mains frequency so as to obtain a first series of samples representative of the current measurements and the voltage measurements. Prior to multiplying corresponding samples of the first and second series, and accumulating the products to obtain the amount of electric power consumed in the load, the samples of the current are corrected for the phase error. To compensate the phase error caused by the current sensor compensated current samples are obtained by application of a formula:

$$I_{n,corr} = I_n - (I_n - I_{n-1}) * t_{mains}^2 * f_{mains,nom} * f_{CLK} * \varphi_{CTnom} / 360°$$

wherein $(I_n - I_{n-1})$ is the difference of two succeeding samples. The other terms are a real, i.e. non-complex, correction factor. All computations are done in the time domain. In particular compensation is done in the time domain and uses only real (non-complex) arithmetic.

There are several drawbacks of the known system. In the known system the term $(I_n - I_{n-1})$ is used as a numerical approximation of the time derivative of the current. Using numerical approximation in the compensating for phase error is a disadvantage, leading to decreased accuracy. Furthermore, the current signal is corrected in its entirety; yet, different harmonic parts of the current signal may require different correction. This is not possible in the known system, which assumes that phase error of current sensors is constant; however, they may depend on the temperature and current. Accuracy of the known system thus varies with temperature and current. The analog to digital conversion of the known system does not convert voltage and current at the same time. This introduces a further delay between voltage and current measurements. This additional error is not corrected in the known system.

SUMMARY OF THE INVENTION

The present invention provides an electric power meter, an integrated circuit, an electric power metering method, and a computer program as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals. In the drawings, FIG. 1a schematically shows an example of an embodiment of an electric power meter 100, FIG. 1b schematically shows an example of an embodiment of an analog to digital converter, FIG. 1c schematically shows an example of an embodiment of a correction unit 140, FIG. 2 schematically shows an example of an embodiment of an electric power meter 100, FIG. 3 schematically shows an example of an embodiment of an electric power meter 300, FIG. 4 schematically shows an example of an embodiment of an electric power meter 400, FIG. 5a schematically shows a front view of an example of an embodiment of an electric power meter 500, FIG. 5b schematically shows an example of an embodiment of an electric power meter 500, FIG. 6 schematically shows an example of an embodiment of an electric power measurement method 600, FIG. 7 schematically shows an example of applying a complex correction factor, FIG. 8 schematically shows an exemplary user interaction system.

Figure 1A:
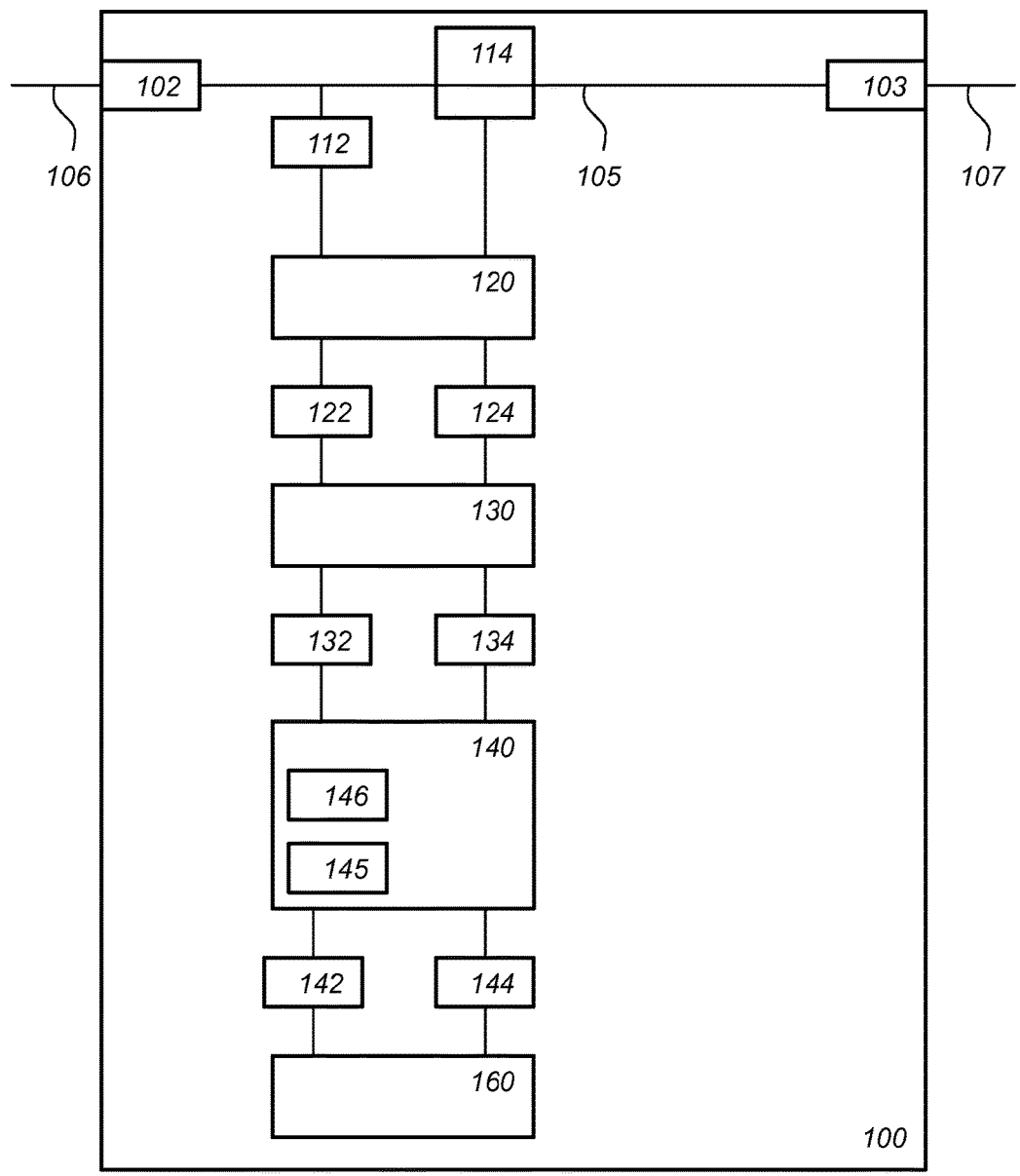

LIST OF REFERENCE NUMBERS IN FIGS. 1A-5B 100 an electric power meter (PWMTR)
102 a first connector
103 a second connector
105 an electric conductor
106 a first electric wire
107 a second electric wire
112 a voltage sensor
114 a current sensor
120 an analog to digital converter (ADC)
122 a voltage sample buffer
124 a current sample buffer
125 a first selector
126 a quantizer
127 a second selector 130 a time to frequency domain converter (CONV)
132 a voltage frequency domain buffer
134 a current frequency domain buffer
140, 140' a frequency domain correction unit (CORR)
142 a corrected voltage frequency domain buffer
144 a corrected current frequency domain buffer
145 a correction factor
146 a complex multiplication unit
147 a control unit
148 a temperature sensor
160 an energy calculation unit (CALC)
200 a calibration unit
300 an electric power meter (PWMTR)
302 a voltage sensor interface
304 a current sensor interface
306 a temperature sensor interface
400 an electric power meter (PWMTR)
402 a first connector for three-phase electric power
403 a second connector for three-phase electric power
405 an electric conductor for three-phase electric power
406 a first electric wire for three-phase electric power
407 a second electric wire for three-phase electric power
500 an electric power meter (PWMTR)
502 a housing
510 a display
520 electric connectors (CON)
522 first phase in and out connector
523 second phase in and out connector
524 third phase in and out connector
525 neutral in and out connector
530 sensors (SNS)
540 analog-to-digital convertors (ADC)
550 a processing block (PRC)
552 a microprocessor (CPU)
554 a memory (MEM)
556 a display driver (DRV)
558 a temperature sensor (TMP)
562 a battery
564 a wired interface
566 a wireless interface

DETAILED DESCRIPTION OF THE
PREFERRED EMBODIMENTS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described.

In the following, for sake of understanding, the circuitry is described in operation. However, it will be apparent that the respective elements are arranged to perform the functions being described as performed by them.

FIG. 1a schematically shows an example of an embodiment of an electric power meter 100.

Power meter 100 comprises a first connector 102 for connecting to a first electric wire 106 and a second connector 103 for connecting to a second electric wire 107. Power meter 100 comprises an electric connection 105 arranged to electrically connect the first connector to the second connector. Power meter 100 may be placed between the wire connecting an electric network, e.g., electricity consuming devices of a household, and an electricity generator. For example, power meter 100 may be used to measure domestic power use. For example, connector 106 may connect to devices in the electric network, and connector 107 may connect, directly or indirectly, to an electricity distributer, such as an electricity generator. Power meter 100 may also be used for measuring industrial electric consumption.

The power meter shown in FIG. 1a is a mono-phase power meter. In such a meter a single wire 105 may be used in power meter 100. However, in an embodiment the power meter measures more-phase power, say double or triple phase power. In addition to the live wire 105, a neutral line may be used. The latter is not shown in the figure. The neutral line may also connect the first connector to the second connector.

Power meter 100 comprises a voltage sensor 112 applied to connection 105, e.g. connected thereto. Different types of voltage sensors are suitable for power meter 100. For example, voltage sensor 112 may comprises a resistor (not shown) connected between connection 105 and ground, e.g., the neutral line. The sensor 112 may measure the voltage drop across the resistor. As an example, voltage sensor 112 may be arranged to measure voltages in the range between 80 and 300 volts; Larger or smaller ranges are possible, e.g., 60 volt to 400 volt or 100 to 200 volt, etc.

Power meter 100 comprises a current sensor 114 applied to connection 105. Different types of current sensors are suitable for power meter 100. For example, current sensor 114 may comprise any one of: a shunt resistor, a current transformer, and/or a Rogowski coil. As an example, current sensor 144 may be arranged to measure currents in the range of 20 mA to 120 A; Larger or smaller ranges are possible. For larger applications, e.g., industry, flats, the current range may be up to 1000 A, or more.

Current sensors 114 may introduce a delay with respect to voltage sensor 112. For example, a current sensor may require a current to voltage conversion process which takes time. As a consequence of this a time shift between voltage and current signals is introduced. This shift is problematic as definitions of power consumption, say $P(t)=u(t)*i(t)$ require concurrent current and voltage information. Note that this definition of power consumption is written in the time domain; P denoting power, u denoting voltage, i denoting current and t denoting time.

Power meter 100 comprises a voltage sample buffer 122 arranged to receive a sequence of digital voltage samples representing voltage measured by voltage sensor 112. Power meter 100 comprises a current sample buffer 124 arranged to receive a sequence of digital current samples representing current measured by current sensor 114.

Power meter 100 comprises at least one analog-to-digital converter 120. Analog-to-digital converter 120 is connected to the voltage sensor 112 and arranged to provide digital voltage samples representing voltage measured by voltage sensor 112 to voltage sample buffer 122. The analog-to-digital converter 120 is connected to current sensor 114 and arranged to provide digital current samples representing current measured by the current sensor 114 to the current sample buffer 124.

In an embodiment, power meter 100 comprises multiple analog-to-digital converters 120, say, separate analog-to-digital converters for voltage sensor 112 and current sensor 114. Having separate analog-to-digital converter allows the voltage and current measurements to be taken simultaneously. Note that obtaining the voltage and current samples at the same time avoids the complication of introducing time delay at the ADC; correction of phase errors introduced elsewhere, in particular in current sensor 114, is discussed below.

Having simultaneous measurement of current voltage simplifies computing the power consumption from the measurements, as computation of power consumption assumes power and voltage values obtained at the same moment.

Having separate analog-to-digital converters may allow the analog-to-digital converter to be configured for a different precision. For example, a larger number of bits may be assigned to the current samples, as these may have a larger range than the voltage samples.

Power meter 100 can correct for voltage and current signals that have been sampled at different times, e.g. using a single ADC; although this may introduce an additional phase error, but this may be corrected together with other phase errors, e.g. of the current sensor (see below).

However, power meter 100 does not require that voltage and current measurements are taken simultaneously. In an embodiment, the analog-to-digital converter 120 has at least two input-channels connectable to the voltage sensor 112 and current sensor 114. The analog-to-digital converter 120 may be arranged to alternately convert the at least two input-channels to a digital value. For example, ADC 120 may alternate converting a voltage measurement from voltage sensor 112 and a current measurement from current sensor 114. An analog-to-digital converter connected to one or more voltage sensor 112 and/or current sensor 114 is considered to be connectable.

Figures 1B, 1C:
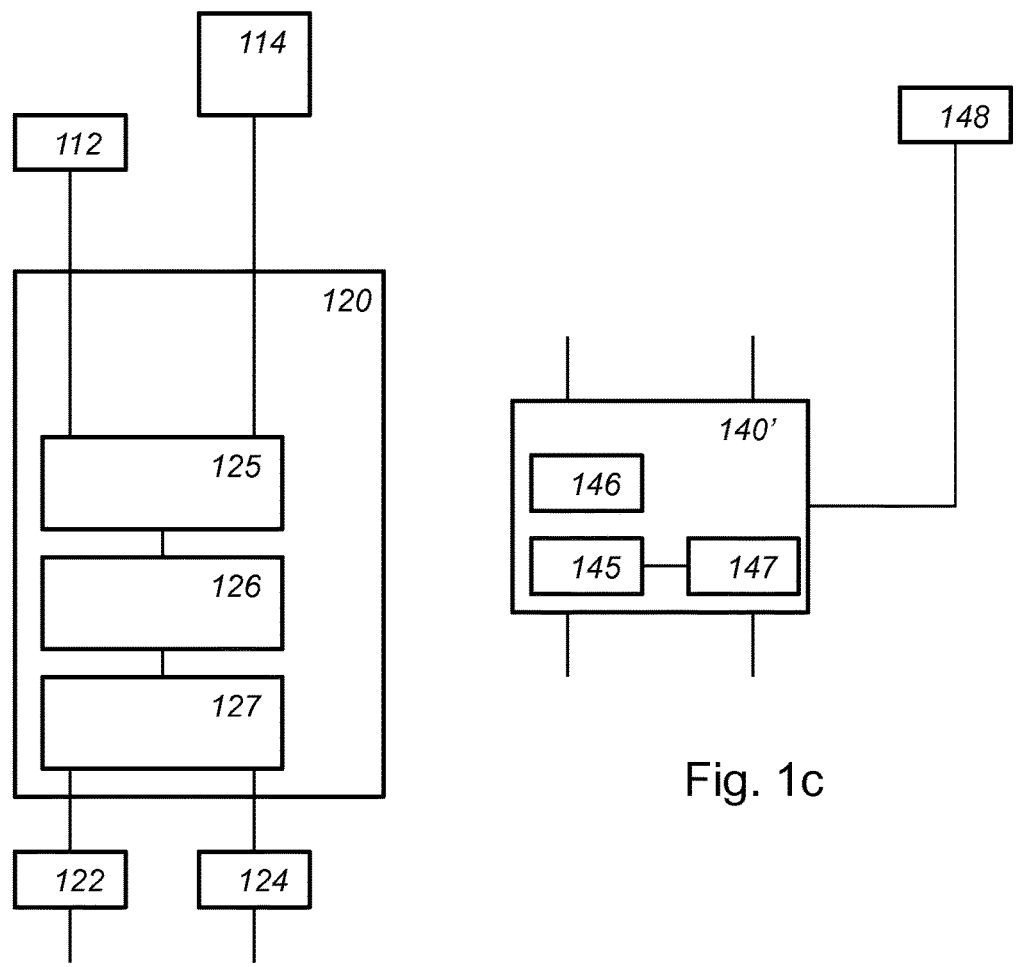

FIG. 1b schematically shows an example of an embodiment of an analog-to-digital converter having at least two input-channels. ADC 120 of FIG. 1b comprises a first selector 125 connected to the at least two channels, in FIG. 1b to voltage sensor 112 and current sensor 114. Selector 125 is arranged to alternately pass one of the at least two inputs to an output of selector 125. ADC 120 of FIG. 1b further comprises a quantizer 126 for converting the analog value on the output of selector 125 to a digital value, and a second selector 127. Second selector 127 passes the digital value on to one of at least two buffers, in this case, buffers 122 and 124. ADC 120 may comprise a selector input (not shown), selectors 125 and 127 may be arranged to select the input channel and output buffer under control of the selector input. The selector input may be controlled by a microcontroller of power meter 100.

Returning to FIG. 1a. In an embodiment, power meter 100 comprises exactly one analog-to-digital converter 120. In an embodiment, sensors 112, 114 may even directly produce digital values, so that no separate analog-to digital converter 120 is needed.

As an example, power meter 100 may be arranged to sample voltage sensor 112 with 3200 Hertz. As an example, power meter 100 may be arranged to sample current sensor 114 with 3200 Hertz. The sample rate may be determined from the frequency of the alternating current on connection 105, and the desired number of harmonics used by frequency domain converter 130 (see below), say 64 harmonics. In this case a sampling rate of 64*50=3200 Hertz is obtained.

A frequency domain converter, e.g. using the FFT algorithm, may require a precise number of samples. This may imply a precise sampling ADC frequency to get the number of samples. For example, 64 samples, with fmain=50 Hz, a frequency of 50*64=3200 Hertz may be used. In this case, ADC 120 may be configured to a sampling frequency of 3.2 kHz. If the ADC samples multiple channels, a sampling frequency of 3.2 kHz per channel may be used.

In an embodiment, an ADC may be used which does not permit a precise number of samples, e.g., the sampling freq. of the ADC cannot be set with a small enough resolution. In this case, ADC 120 may be arranged to a higher frequency rate than required by the time to frequency algorithm. For example, to obtain 115 samples, even if we need only 64. In this case, the ADC may be set, e.g., to 5.75 kHertz. From the samples obtained in this manner, a smaller number of samples is recalculated, e.g., 64 in this example. The latter may use a method known as resampling. In an embodiment, ADC 120 is configured to resample the sequence of digital current and/or voltage samples, reducing the size of the sequence.

Power meter 100 comprises a frequency domain converter 130 arranged to convert the sequence of digital voltage samples from the time domain to a frequency domain obtaining digital voltage frequency components, and to convert the sequence of digital current samples from the time domain to the frequency domain obtaining digital current frequency components. Frequency domain converter 130 is connected to voltage sample buffer 122 and current sample buffer 124. Frequency domain converter 130 may use any of a number of algorithms to convert a sequence of time domain values, such as voltage samples or current samples to the digital domain. For example, frequency domain converter 130 may comprise an implementation of the Fast Fourier Transformation (FFT), Discrete Fourier Transformation (DFT), Convolution, Correlation, etc. for time to frequency conversion. The frequency domain results are frequency components. The frequency components may be expressed in different ways, e.g. as a sequence of coefficients of sine and cosine waves. The frequency components may also be expressed as complex numbers. These two representations may be converted to each other. Complex numbers may be represented as a pair of an imaginary value and a real value, or an angle and magnitude; these representations may be converted into each other. We will refer to frequency components as complex numbers, allowing any way to represent the complex numbers.

Thus at least three different ways of representing complex numbers may be used interchangeably: sine/cosine coefficients, real/imaginary coordinates, magnitude/angle representation.

Frequency domain converter 130 may alternately convert samples from buffer 122 and buffer 124. Frequency domain converter 130 may wait until buffers 122 and/or buffer 124 is full before converting.

The size of the Fourier transform depends on the application of the power meter. A larger number of frequency components increase precision. In an embodiment, the number of frequency components is 64. Larger or smaller numbers are possible, say 128 or 32.

The size of buffers 122 and 124 may be chosen so that at least the same number of voltage/current samples fit in the buffers 122 and 124 as frequency components produced by frequency domain converter 130. For example, buffers 122 and 124 may each hold at least 64 digital samples, and buffers 132 and 134 may each hold at least 64 complex frequency components.

Power meter 100 comprises a voltage frequency domain buffer 132 and a current frequency domain buffer 134. Frequency domain converter 130 is connected to voltage frequency domain buffer 132 and current frequency domain buffer 134. Converted voltage samples of voltage sample buffer 122 are placed by frequency domain converter 130 in voltage frequency domain buffer 132. Converted current samples of current sample buffer 124 are placed by frequency domain converter 130 in current frequency domain buffer 134.

Power meter 100 comprises a frequency domain correction unit 140 arranged to correct the voltage frequency components and the current frequency components by multiplying at least one frequency component of the current frequency components and the voltage frequency components with a complex correction factor 145 using a complex multiplication unit 146. Correction unit 140 may place the corrected voltage and current frequency components in a corrected voltage frequency domain buffer 142 and a corrected voltage frequency domain buffer 144, respectively. In an embodiment, no voltage frequency components are corrected; in this embodiment corrected voltage frequency domain buffer 142 may be the same buffer as voltage frequency domain buffer 132. In an embodiment, the corrections are applied in place, in this case corrected voltage frequency domain buffer 142 and corrected current frequency domain buffer 144 may re-use the buffers voltage frequency domain buffer 132 and current frequency domain buffer 134. In an embodiment, corrected voltage frequency domain buffer 142 and corrected current frequency domain buffer 144 are different from voltage frequency domain buffer 132 and current frequency domain buffer 134, e.g., located at different addresses of an electronic memory.

'In place' correction refers to applying correction which stores corrected data at the same location as the uncorrected data.

Power meter 100 comprises an energy calculation unit 160 arranged to compute the electric power from the corrected voltage and current frequency components in corrected voltage frequency domain buffer 142 and corrected current frequency domain buffer 144. Computing electric power from voltage and current frequency components is known per se, and may e.g., use Parseval's theorem. Different types of electric power may be computed, e.g., active and reactive energy, active and reactive power, RMS voltage and current, etc. Energy calculation unit 160 may transmit the computed power, e.g., over a wired or wireless interface, say to a computer, or a server. Energy calculation unit 160 may show the computed power, e.g., on a display of power meter 100.

Complex multiplication unit 146 may perform a complex multiplication using a representation in a pair of values, e.g., an imaginary and a real value. For example a frequency component f, say represented as $(x_1+y_1*i)$, which may be represented by the pair $(x_1,y_1)$, may be multiplied by a complex correction factor $(x_2+y_2*i)$ using the convention that the imaginary unit i satisfies $i*i=-1$.

Figure 7:
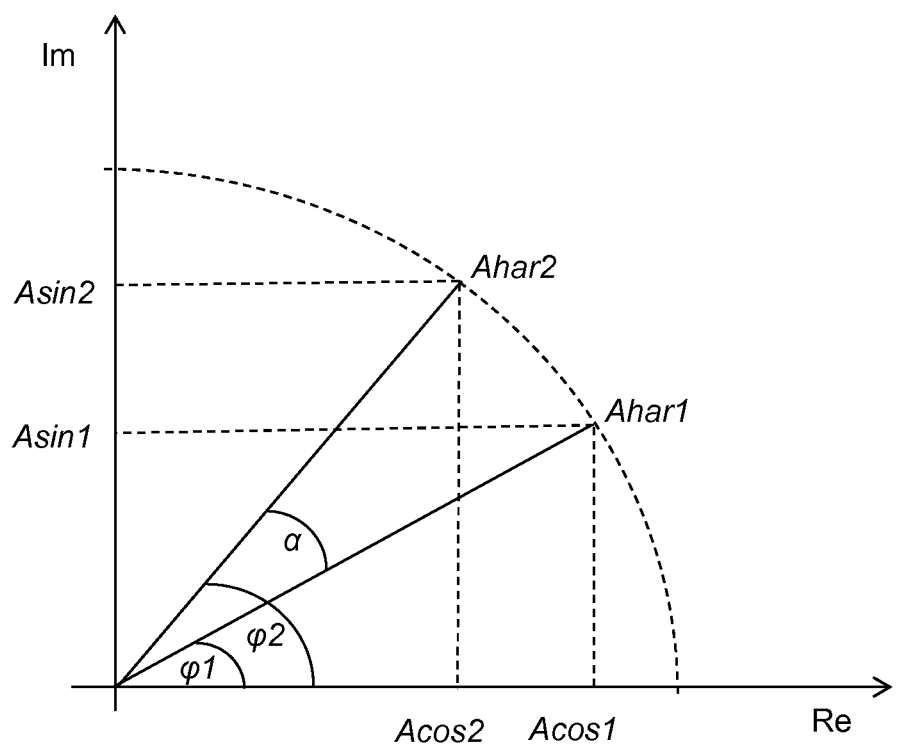

FIG. 7 schematically illustrates an alternative way to perform the complex multiplication. Ahar1 represents the frequency component f, which is multiplied by the complex multiplication factor represented by the angle $\alpha$. The corrected frequency component is represented as Ahar2. Ahar1 and Ahar2 may be represented with a magnitude and an angle $\varphi$. Also shown are projections on the real and imaginary axis, A sin1 and A cos1 for Ahar1, and A sin2 and A cos2 for Ahar2. The latter may be used to represent the frequency components as coefficients of a sine and cosine term respectively.

In the embodiment shown in FIG. 7, the complex correction factor has a magnitude of 1, which allows representation as only an angle. In an embodiment, the complex correction factor has a magnitude different from 1.

In an embodiment, the frequency domain correction unit 140 is arranged to correct multiple frequency components of the voltage frequency components and the current frequency components by multiplying multiple, or even each of, the multiple frequency components with one of multiple complex correction factors using complex multiplication unit 146. This allows phase error correction for individual harmonics.

Compare this to performing correction in time domain: there the signal is one data pack to which a single correction is applied for the full signal. However, in the frequency domain a decomposed signal contains the harmonic parts, so more information is available compared to the time domain. For example, one may decide what signal components are important for the current application and which are not needed. The unneeded components may be removed from the calculation process.

In an embodiment, current sensor 114 is delayed with respect to voltage sensor 112. Frequency domain correction unit is arranged to correct the time delay of the current sensor 114 by multiplying one or more current frequency components with complex correction factors 145 using the complex multiplication unit 146. A time delay in the time domain may be corrected in the frequency domain by multiplying each current frequency components with a different power of the complex correction factor 145.

For example, if the current sample have been converted to a sequence of frequency components, $(f_k)$ and if the correction factor is c, the new sequence may be obtained as $(c^k)*f_k$. In this case each frequency component is multiplied. The correction factor is c is determined to counter the delay of the current sensor. Note that in addition to the factor $(c^k)$, the frequency component $f_k$ may be multiplied with additional correction factors, e.g., to correct a non-linearity occurring at this particular frequency. In such an embodiment, $f_k$ may be multiplied by $c_k*h_k$, wherein $c_k$ corrects time delay, e.g., $c_k=(c^k)$ and $h_k$ is an individual correction term specific for frequency component $f_k$. If there are 64 frequency components, k runs from 1 to 64. In an embodiment, the $c_k$ terms have a magnitude of 1.

Letters in superscript refer to powers. Letters in subscript refer to indices.

In an embodiment, the term $h_k$ corrects nonlinearities at individual harmonics; for frequency components that do not require additional correction one may set $h_k=1$ for that term. In an embodiment, the term $c_k$ is a complex correction that corrects general time delay, whereas the term $h_k$ may be used to correct nonlinearities in the amplitude, in the latter case the terms $h_k$ may be real number; in particular all $h_k$ may be real numbers.

The two factors may be applied separately, say first $c_k$ and second $h_k$, or the other way round. In an embodiment, the terms are pre-multiplied together $(c_k*h_k)$ and stored in that form. For real $h_k$ this requires a modest storage requirement increase, yet halves the number of complex multiplications. For complex $h_k$, the amount of storage does not increase.

If the correction factor c is represented as only an angle (ui_alfa in the code below), the powers of c may be efficiently computed as multiples of the angle. In this case, the complex multiplication may use the angle-addition goniometric formulas. The pseudo code below provides an example. Note that this pseudocode has been simplified for readability; for example, production code may include error recovery, fixed point arithmetic and the like.

ui_fi: represents powers of the correction factor (represented as an angle)
    ui_n: represents the number of frequency components, e.g., of the current samples
    sin/cos: represents sine and cosine functions. These may be implemented as lookup tables.

pFFT: points to an array of frequency components records. RealFix and ImgFix represent the real and imaginary part.

```
ui_fi = ui_alfa; // angle initialization
    for (ui_i = 0; ui_i < ui_n; ui_i++)    // Phase recalculation cycle
        pSin = sin (ui_fi ); // SIN coeficients pointer init (Imag)
        pCos = cos( ui_fi); // COS coeficients pointer init (Real)
        // Real_out = Real_in * cos(fi) – Img_in * sin(fi)
        pFFT->RealFix = (*pCos) * pFFT->RealFix – (*pSin) *
pFFT->ImgFix;
        // Img out = Real_in * sin(fi) + Img_in * cos(fi)
        pFFT->ImgFix = (*pSin) * pFFT->RealFix + (*pCos) *
pFFT->ImgFix;
        pFFT++; //Increment pointer
        ui_fi += ui_alfa; //Increment angle
    }
```

The complex correction factor may be stored in an electronic memory of power meter 100. For example, the complex correction factor(s) may be downloaded from a computer network, say over the Internet, say using ZigBee, Wi-Fi, etc. The complex correction factor(s) may be stored in power meter 100 during manufacture, or during a calibration procedure. The complex correction factor(s) may be stored in non-volatile writable memory, say Flash or in non-volatile, read-only memory, say ROM.

The correction factor may also correct a phase error of a frequency component. Time delay may be corrected by correcting multiple frequency components. Both these cases may be obtained using only correction factor(s) with a magnitude of 1. The amplitude of a frequency component may also be corrected. The latter may use complex correction factor having a magnitude (also known as the norm) different from 1.

Buffers 122, 124, 132, 134, 142 and 144 may be implemented in electronic memory, say in volatile memory, such as RAM.

FIG. 1c schematically shows an example of an embodiment of a correction unit 140'. Embodiment of correction unit 140' of FIG. 1c is an alternative for unit 140 in FIG. 1a.

In an embodiment, frequency domain correction unit 140' is arranged to receive environment information for the voltage sensor 112 and the current sensor 114. The frequency domain correction unit 140' comprising a control unit 147 for determining the complex correction factor 145 from at least the environment information. Using environment information improves the correction applied to the frequency components, and thus the precision of the power meter.

Environment information gives information on factors in the current environment of sensor 112 and/or sensor 114 that affect the performance of these sensors.

In an embodiment, the environment information comprises a temperature measurement from a temperature sensor 148. Power meter 100 may comprise the temperature sensor 148 for this purpose. Different temperatures affect the performance of sensors 112 and 114. This embodiment is shown in FIG. 1c. Temperature sensor 148 may be placed inside power meter 100.

In an embodiment, the environment information comprises a digital current sample representing current measured by the current sensor 114. Hereby, no separate sensor is needed for this environment information as the power meter has access to the measurements of current sensor 114. Different levels of current affect the performance of sensors 112 and 114.

Mapping environment information onto one or more correction factors may be done in a number of ways.

For example, in an embodiment, control unit 147 comprises a look-up table. The control unit 147 is arranged to look-up the complex correction factor 145 under control of the environment information. For example, the look-up table may comprise a number of temperature ranges or current ranges, with each range one or more correction factors being associated. Control unit 147 is configured to determine in which range a temperature measurement or current measurement falls, and to look-up the associated correction factor. For example, a look-up table for temperature may comprise three ranges; say below 10 degrees Celsius, from 10 to 25 degrees Celsius, and above 25 degrees Celsius. Each of these ranges may have an associated correction factor. For example, one or more, or even all of the frequency components may have a correction factor. This allows fine grained correction of the frequency components of the sensor measurements. For example, each of the ranges may have a correction factor used for correcting time delay, e.g., as explained above. These ranges are only an example; there may be more or fewer ranges, the ranges may have different boundaries.

In an embodiment, the look-up table stores a correction factor for each combination of a temperature range and a current range. For example, for two temperature ranges and two current ranges, four correction factors may be stored. An example of the combinations may be: (temp<25 C, current<10 A), (temp<25 C, current>=10 A), (temp>=25 C, current<10 A), (temp>=25 C, current>=10 A). There may be more or fewer ranges, having open and/or closed intervals. The boundaries are examples, and may differ in an embodiment.

In an embodiment, control unit 147 comprises an interpolation function for computing the complex correction factor or factors 145 from at least the environment information. For example, the interpolation function may take as input the temperature and/or or the current and produce as output the correction factor. For example three example functions may be: $g_1(T)$, $g_2(I)$, $g_3(I,T)$. Here $g_i$ denotes a function, I denotes current, T denotes temperature. The functions may be polynomial functions.

In an embodiment, control unit 147 is configured with the time delay (A) of sensor 114 for a particular temperature, say 25° C. and with a known temperature dependencies curve (B(t)). The curve may be implemented as a function, say a polynomial function, or as a look-up table. To determine the control function 147 may determine (A+B(t)), wherein t is the temperature received from sensor 148.

A function or a larger number of ranges in the look-up table avoids discontinuity in the correction factor, and accordingly avoids swings in the consumed power calculated.

New correction value may be obtained at each conversion from time to frequency. Fewer changes to the correction value or values are also possible; say one in a time interval, say, once every 5 minutes.

The current may show short and strong swings. To avoid strong swings in the correction factor, a moving average of the current may be used instead of the present current.

The table below gives test result for an embodiment as in FIG. 1a, correcting time delay of the current sensor 114 in the frequency domain. The first column given the test signal used; the phase difference gives the phase angle between voltage and amperage. The second column give the error of the power meter with correction unit 140, the third column gives the error of a power meter like power meter 100 but without block 140.

| Test point<br>Voltage/Ampere/<br>Phase difference | Error [%]<br>comp. On | Error [%]<br>comp. Off |
|---|---|---|
| 230 V/5 A/0° | 0.02 | 0.06 |
| 230 V/5 A/−45° | −0.22 | 9.01 |
| 230 V/ 5A/+45° | 0.24 | −8.87 |

Power meter 100 is more accurate for all test signals, and is especially more accurate for test signals with large phase angles.

Figure 2:
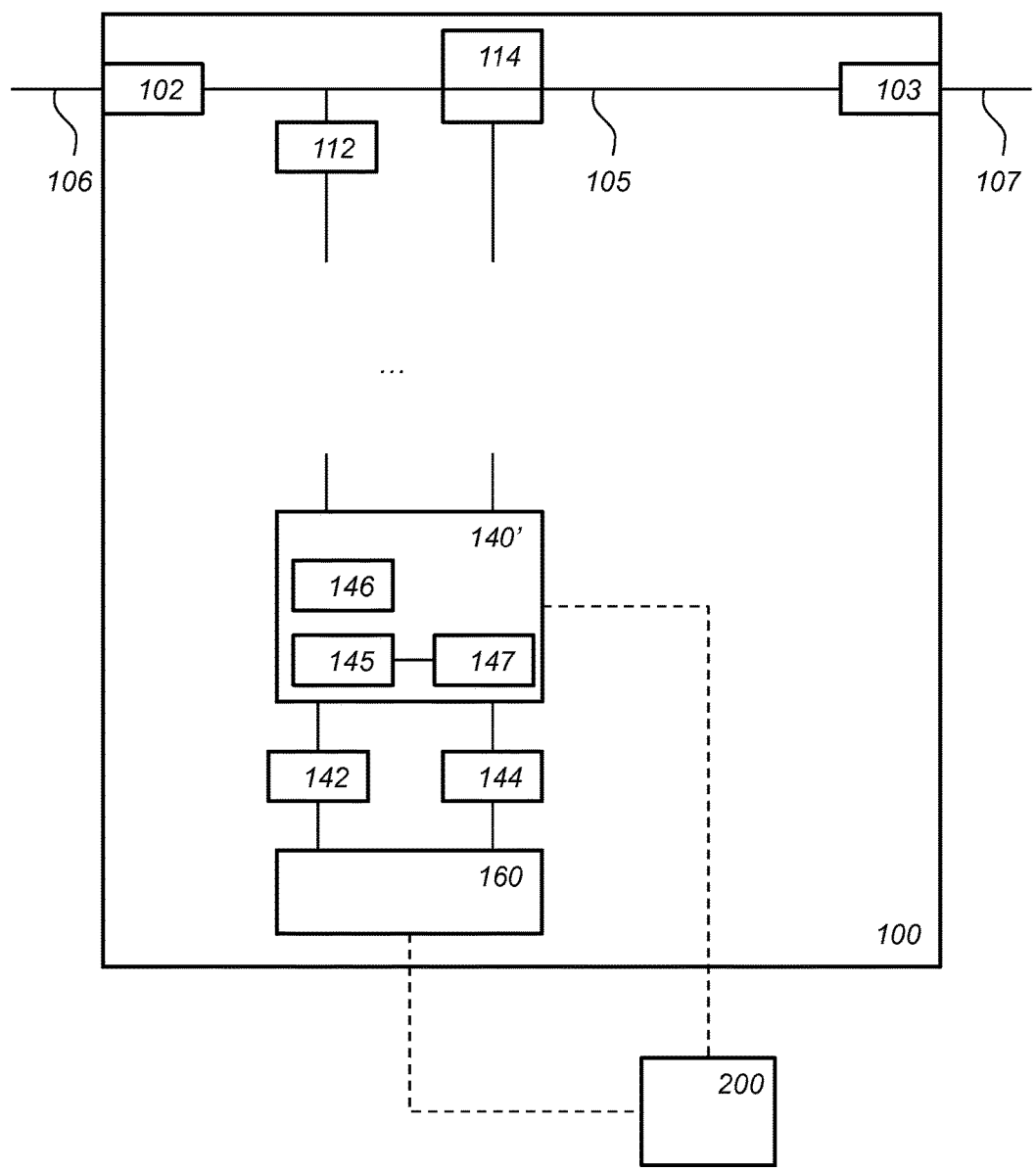

FIG. 2 schematically shows an example of an embodiment of an electric power meter 100. Power meter 100 is included in a so-called test bench. At connectors 102 and 103 a known signal is generated. A calibration unit 200 is shown in FIG. 2. For example, a known signal may have 230 volt, 5 Ampere, and a phase difference of 45 degrees.

In an embodiment, calibration unit 200 is connected to energy calculation unit 160 to receive the electric power computed by energy calculation unit 160. The computed power may use corrected voltage and current frequency components, however for simplicity power meter 100 may be configured with correction factor equal to 1=1+0*i (or equivalently, angle=0). In this case, the corrected voltage and current frequency components in corrected voltage frequency domain buffer 142 and corrected current frequency domain buffer 144 are equal to the uncorrected frequency components.

Calibration unit 200 may compare the frequency components in buffers 142 and/or 144 with expected frequency component values, e.g., frequency component values expected for the test signal. When a frequency component in buffers 142 and/or 144 differs from the expected value, a correction factor corresponding to the differing frequency component may be adjusted by calibration unit 200 to compensate the difference.

Calibration unit 200 may compare a power computed by energy calculation unit with expected power values, e.g., power values expected for the test signal. Calibration unit 200 may adjust correction factors to compensate the difference. In this embodiment, Calibration unit 200 may adjust a single correction factor used to correct time delay in the current sensor value.

For the latter case a particular efficient solution is possible: In an embodiment, energy calculation unit 160 computes the active energy and reactive energy. Calibration unit 200 may be configured to compute the ratio between them. The ratio may be used as correction factor to correct time delay. Energy calculation unit 160 could also compute active power and reactive power, and calibration unit 200 the ratio there between obtaining the same result.

The correction factor determined by calibration unit 200 is stored in correction unit 140 or 140'. Receiving and storing of information by calibration unit 200 is indicated by dashed lines in FIG. 2.

Instead of receiving information from energy calculation unit 160, calibration unit 200 may also or instead receive information from corrected voltage frequency domain buffer 142 and corrected current frequency domain buffer 144. This allows the calibration unit 200 to determine individual correction factors for each of the frequency components.

Figure 3:
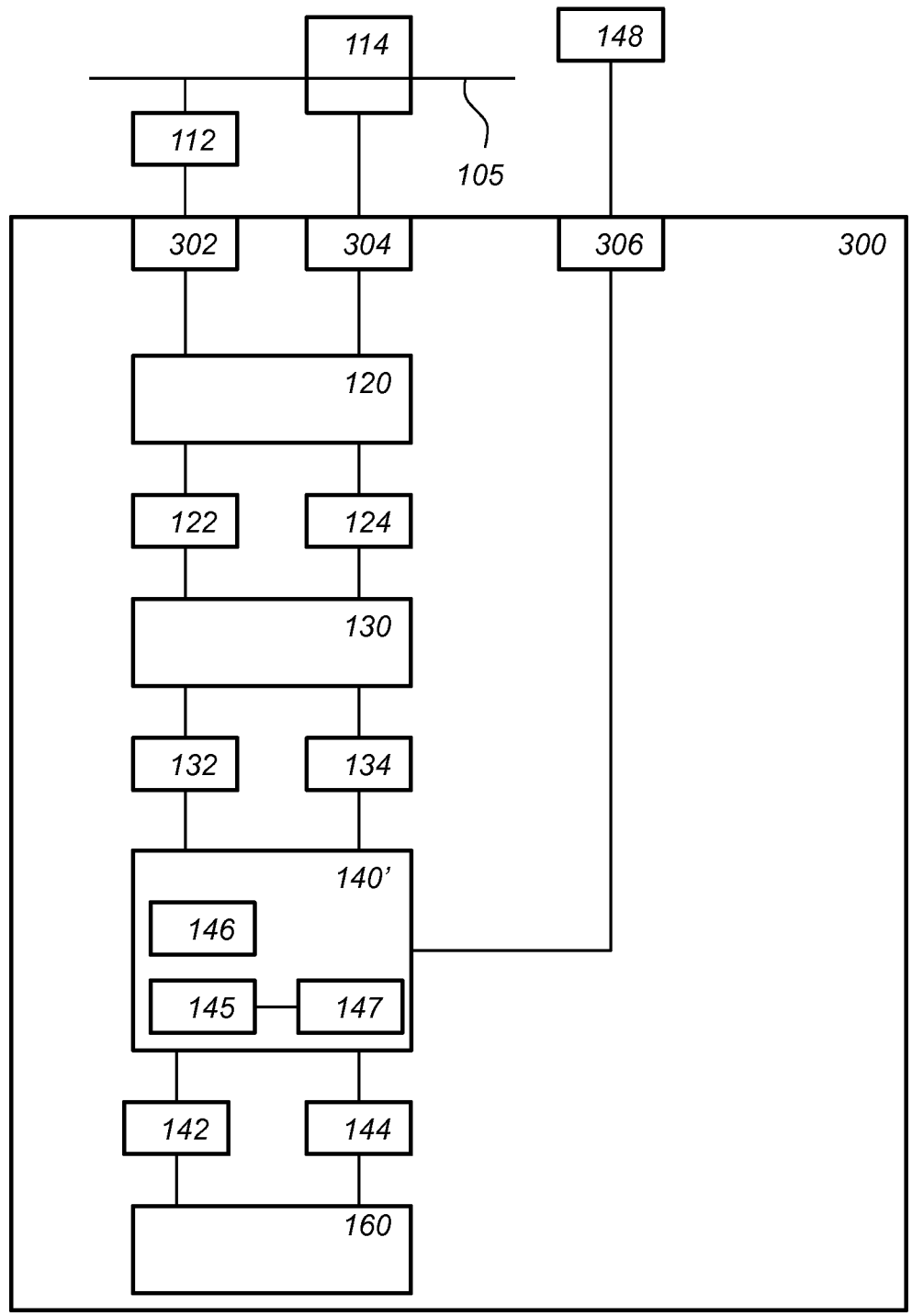

FIG. 3 schematically shows an example of an embodiment of an electric power meter 300. Power meter 300 is like power meter 100 except that the voltage sensor 112 and current sensor 114 are located outside power meter 300. Power meter 300 comprises a voltage sensor interface 302 for receiving voltage measurements, a current sensor interface 304 for receiving current measurements. In an embodiment, power meter 300 comprises a temperature sensor interface 306 for receiving temperature measurements indicating the temperature at voltage sensor 112 and/or current sensor 114.

In an embodiment, power meter 300 does not comprise ADC 120. One or more voltage sensors, one or more current sensors are combined with one or more analog to digital converts in an integrated measurement device. The measurement device sends a signal to power meter 300. The signal represents digital measured values of the voltage and current sensor. Power meter 300 uses the received signal to compute the power consumed.

Figure 4:
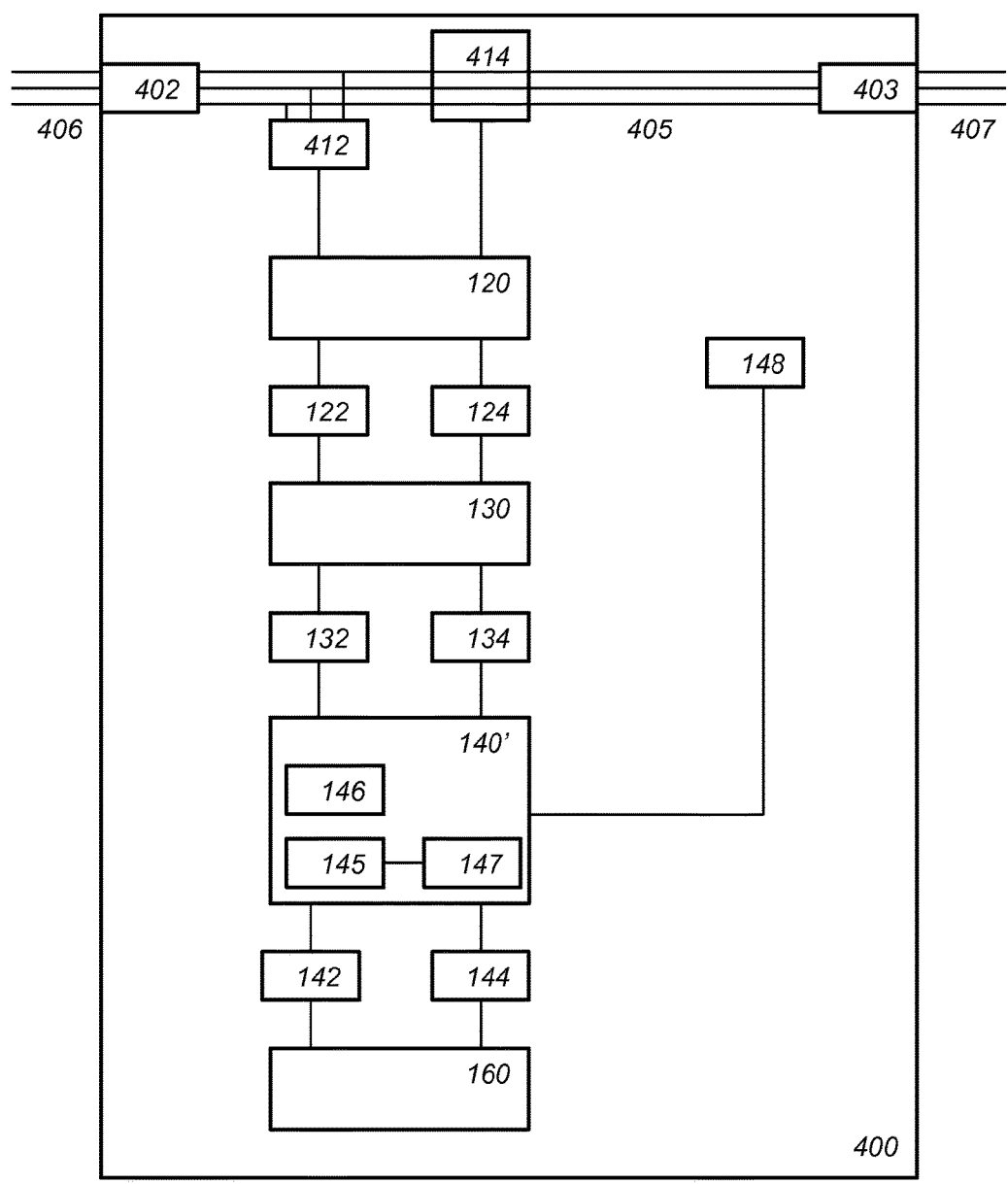

FIG. 4 schematically shows an example of an embodiment of an electric power meter 400. Power meter 400 is like power meter 100 except that power meter 400 is arranged for three-phase electric power. Power meter 400 comprises a first connector 402 and a second connector 403 for receiving and forwarding three-phase power. Connector 402 and 403 may be arranged to connect to a three-phase power cable. Connector 402 and 403 may each comprise 4 individual connectors for receiving or forwarding each of three power lines, and a neutral line. (The neutral line is not shown). Power meter 400 comprises electric conductors 405 for connecting each of the three phases between connectors 402 and 403. In addition a neutral line connection may be made between connectors 402 and 403. FIG. 4 only shows the power lines in connections 405 for each of the three phases.

A first electric wire 406 connects to connector 402 and a second electric wire 407 to connector 407. The electric wires 406 and 407 may comprise 4 individual lines, e.g., for the three phases and a neutral line. These lines may be combined in an integrated wire, e.g., with common insulation, but this is not necessary.

Voltage sensor 412 comprises three sensing parts, for sensing voltage on each one of the three power lines on connections 405. Current sensor 414 comprises three sensing parts, for sensing current through each one of the three power lines in connections 405.

ADC 120 is configured to convert the measurements from sensor 412 and sensor 414 to digital values. In this embodiment, there are 3 voltage and 3 current measurements to convert. In an embodiment, power meter 400 comprises one, or less than 6 ADCs, for converting these measurements. In an embodiment, power meter 400 comprises at least 6 ADCs, for converting these measurements. As explained for power meter 100, the measurement may be corrected in the frequency domain, especially to correct for time delay, especially time delay of the current sensor 414. Energy calculation unit 160 is arranged to compute power consumption from the corrected frequency components.

Power meter 400 may be adapted for two-phase power, using two instead of three connecting power wires.

Figure 5A:
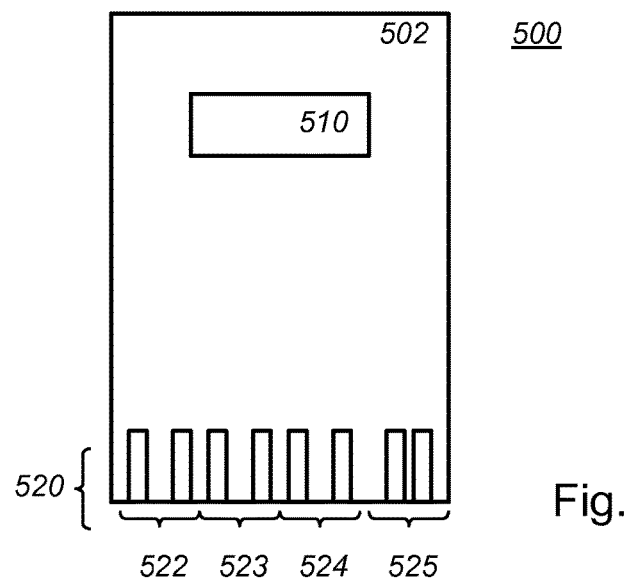

FIG. 5a schematically shows a front view of an example of an embodiment of an electric power meter 500. Power meter 500 as shown is arranged for three-phase power, but may be adapted for mono or two-phase.

Power meter 500 comprises a housing 502. Power meter 500 comprises a display 510. Display 510 may be a LCD display, OLED display and the like. Display 510 may be used by an energy calculation unit to display consumed power, e.g., currently consumed power, accumulated consumed power, and the like.

Power meter 500 comprises an electric connector 520. Shown in FIG. 500 are first phase in and out connector 522, second phase in and out connector 523, third phase in and out connector 524, neutral in and out connector 525. For example, the in-parts of connectors 522, 523, 524 and 525 may be regarded as a type first connector 402; the out-parts of connectors 522, 523, 524 and 525 may be regarded as a type second connector 403.

Figure 5B:
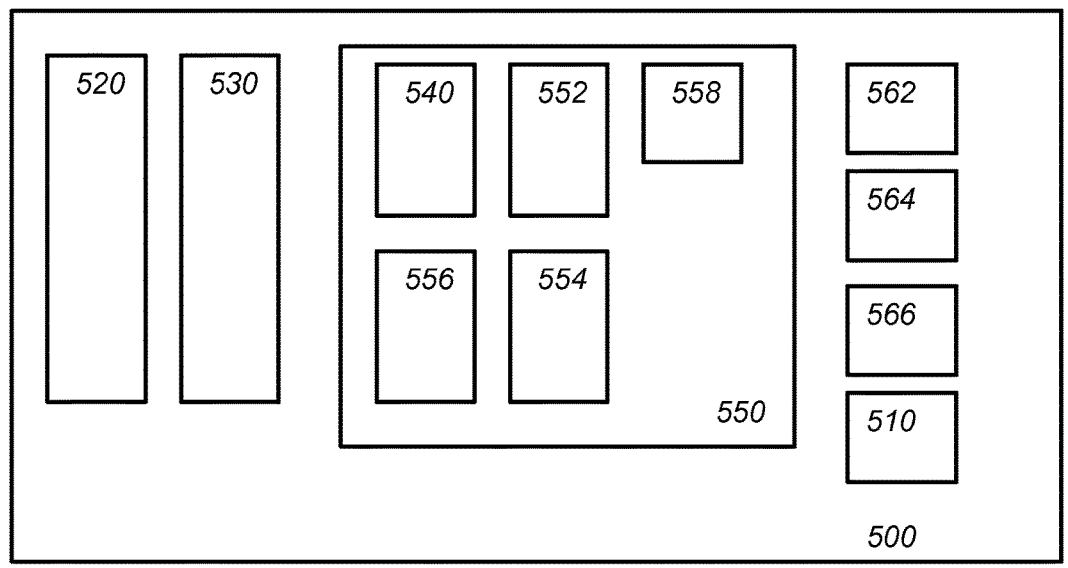

FIG. 5b schematically shows an example of an embodiment of an electric power meter 500.

Power meter 500 comprises sensors 530, e.g., three voltage and three current sensors: one voltage and one current sensor for each of the connectors 522, 523, and 524.

Power meter 500 comprises analog-to-digital convertors 540. Power meter 500 may use a single or multiple analog-to-digital convertors. For example, power meter 500 may use a single analog-to-digital convertors to convert the three voltage sensors and a use a single analog-to-digital convertors to convert the three current sensors. This arrangement allows different precisions for the two ADCs.

Power meter 500 comprises a display driver 556, for driving display 510. For example driver 556 may be an LCD driver or an OLED driver.

Power meter 500 comprises a microprocessor 552 and a memory 554. Memory 554 may comprise a volatile and non-volatile part. The non-volatile part may be partly read-only. Processor 552 is configured to execute software stored in memory 552. Memory 552 may store one or more correction factors. Memory 552 may store buffers for storing voltage and current samples, frequency domain conversions thereof and corrected frequency components.

For example, the software may cause the processor to configure ADC 540 to repeatedly convert samples values of sensor 530, so that memory 552 receives a sequence of digital voltage samples representing voltage measured by a voltage sensor and a sequence of digital current samples representing current measured by a current sensor. In this case three sequences of voltage samples and three sequences of current samples are obtained.

The software may comprise a time domain to frequency domain conversion block configured to convert the sequence of digital voltage samples from the time domain to a frequency domain obtaining digital voltage frequency components, and converting the sequence of digital current samples from the time domain to the frequency domain obtaining digital current frequency components. In this case three sequences of voltage frequency components and three sequences of current frequency components are obtained.

The software may comprise a frequency domain correction block to correct the voltage frequency components and the current frequency components by multiplying at least one frequency component of the current frequency components or the voltage frequency components with a complex correction factor.

The software may comprise an energy calculation block to compute the electric power from said corrected voltage and current frequency components.

In an embodiment, power meter 500 may comprise a temperature sensor 558, e.g., for use as environmental information. Temperature sensor 558 may be located inside housing 502, so as to measure temperature inside housing 502.

Power meter 500 may comprise a battery 562 (shown) or some other power source. Power meter 500 may comprise a further ADC to convert measurements of the battery and/or temperature sensor.

Power meter 500 may comprise other connections, e.g., a wired interface 564 and/or a wireless interface 566. The wired interface may be universal metering interface (UMI), or say an USB connection, etc. Wireless interface 566 may be a ZigBee interface, or an Wi-Fi interface, etc.

The wired and wireless interfaces may be used to configure power meter 500, e.g., to calibrate the device. The wired and wireless interfaces may be used to send power consumption information as measured by the device to an external computer, say a server.

Microprocessor 552, memory 554, and analog-to-digital convertor 540 may be combined into a processing block 550. In an embodiment, processing block 550 also comprises display driver 556 and/or temperature sensor 558.

Processor block 550 may be implemented as an integrated circuit. The integrated circuit may be embedded in a semiconductor substrate. The semiconductor substrate can be any semiconductor material or combinations of materials, such as gallium arsenide, silicon germanium, silicon-on-insulator (SOI), silicon, monocrystalline silicon, the like, and combinations of the above.

Also for example, in one embodiment, the illustrated elements of power meter 500 are circuitry located on a single integrated circuit or within a same device. Alternatively, power meter 500 may include any number of separate integrated circuits or separate devices interconnected with each other. For example, memory 554 may be located on a same integrated circuit as processor 552 or on a separate integrated circuit or located within another peripheral or slave discretely separate from other elements of power meter 500. I/O circuitry may also be located on separate integrated circuits or devices. Also for example, power meter 500 or portions thereof may be soft or code representations of physical circuitry or of logical representations convertible into physical circuitry. As such, power meter 500 may be embodied in a hardware description language of any appropriate type.

Figure 6:
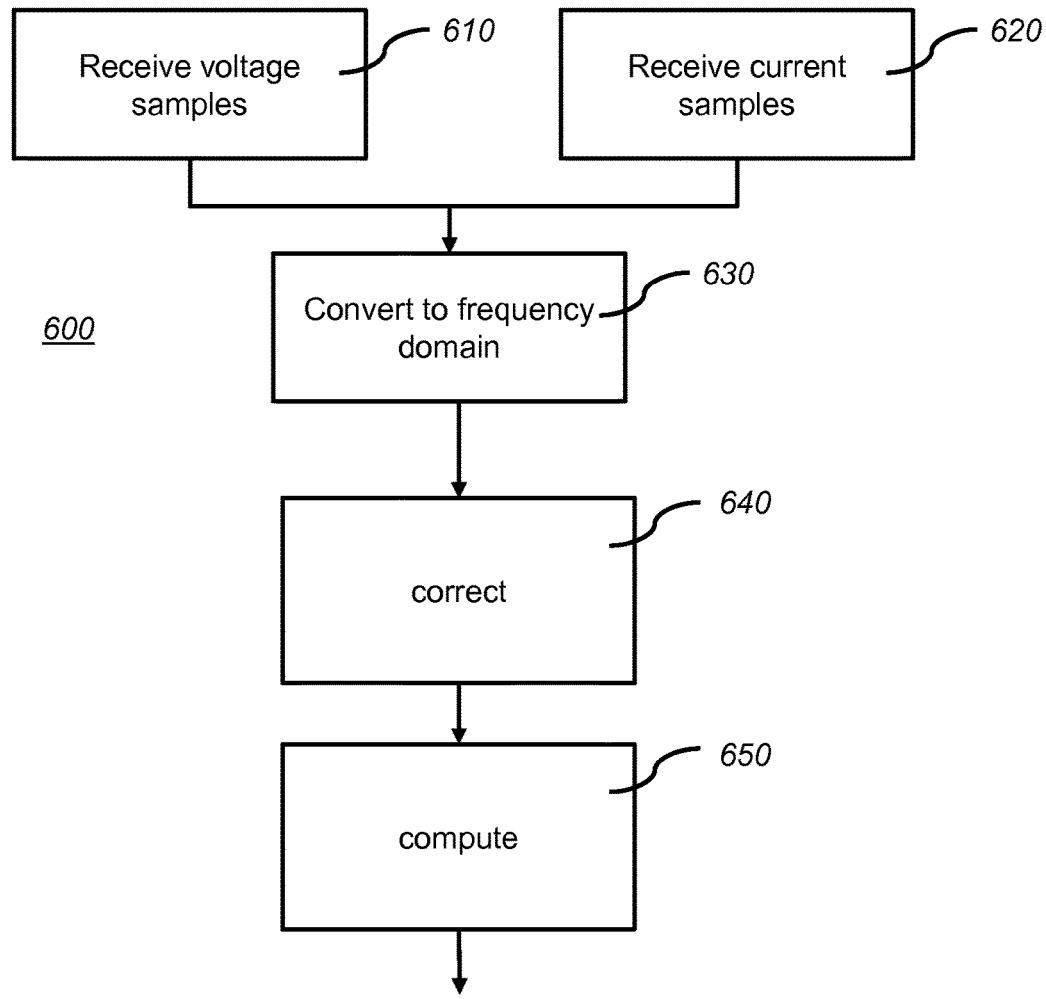

FIG. 6 schematically shows an example of an embodiment of an electric power measurement method 600. Power measurement method 600 comprises:

Receiving 610 a sequence of digital voltage samples representing voltage measured by a voltage sensor 112, Receiving 620 a sequence of digital current samples representing current measured by a current sensor 114, Converting 630 the sequence of digital voltage samples from the time domain to a frequency domain obtaining digital voltage frequency components, and converting the sequence of digital current samples from the time domain to the frequency domain obtaining digital current frequency components, Correcting 640 the voltage frequency components and the current frequency components by multiplying at least one frequency component of the current frequency components or the voltage frequency components with a complex correction factor 145, Computing 650 the electric power from said corrected voltage and current frequency components.

The receiving 610 and 620 may be done interleaved, or the samples may be received simultaneously. The method may be adapted as in any of the embodiments shown herein.

Figure 8:
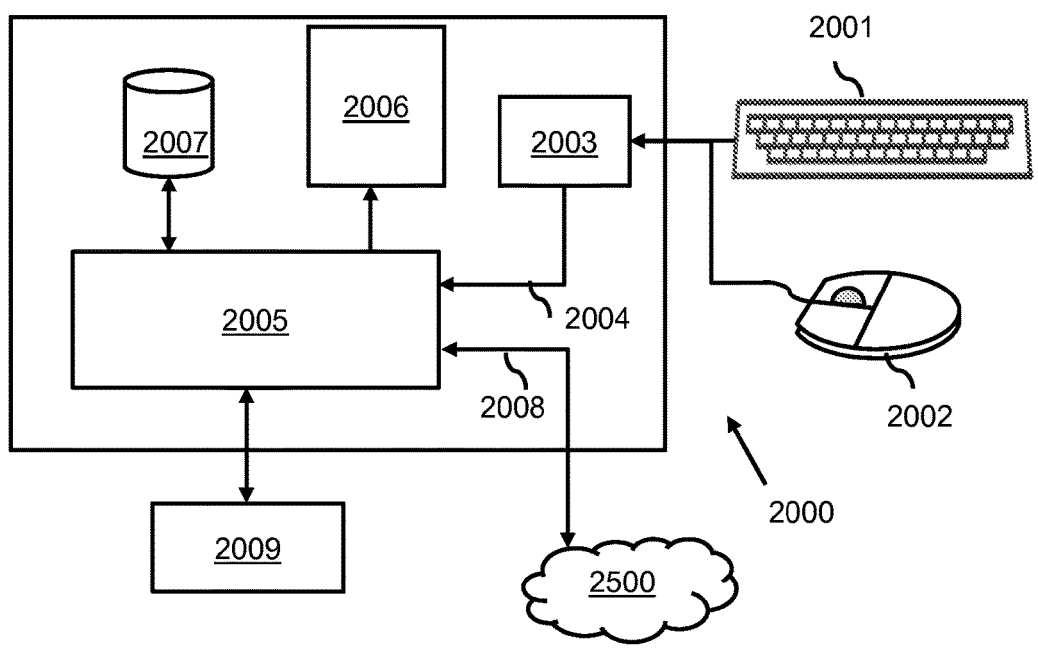

FIG. 8 schematically shows an exemplary user interaction system 2000 having a programmable processor 2005. The user interaction system 2000 is shown to be a personal computer, but may be any type of suitable user interaction system 2000. The programmable processor may comprise one or more components of system 100. The user interaction system 2000 further comprises a storage unit 2007, a user input 2003 and a display 2006, which may be the same as display 521 in FIG. 2 or an additional display. The user input 2003 allows the user to input user data and user instructions 2004 to the processor 2005 by e.g. using a keyboard 2001 or a mouse 2002. Also, although not shown, the display 2006 may comprise a touch-sensitive surface for enabling the user to provide user data and user instructions to the user input 2003 by means of touching the display 2006. The processor 2005 is arranged to perform any one of the methods according to the invention, to receive user data and user instructions 2004, to present visual information on the display 2006 and to communicate with a data I/O device 2009, such as an optical disc drive or a solid state reader/writer. The processor 2005 is arranged to cooperate with the storage unit 2007, allowing storing and retrieving information on the storage unit 2007, such as voltage and current measurement samples, etc. The user interaction system 2000 may further comprise a communication channel 2008 allowing the processor 2005 to connect to an external cloud 2500 for communicating with other devices in the cloud. The external cloud may e.g. be the Internet. The user interaction system 2000 may allow a user to retrieve power consumption values, including overviews of past power consumption.

The processor 2005 may be capable to read, using the data I/O device 2009, a computer readable medium comprising a program code. The processor 2005 may be capable to read, using the data I/O device 2007, a computer readable medium comprising a computer program product comprising instructions for causing the user interaction system 2000 to perform an electric power metering method for measuring electric power.

User interaction system 2000 may comprise a voltage and current sensor and/or an analog to digital converter. However, user interaction system may also be configured to receive digital voltage and current sensor values from an external a voltage and current sensor and/or analog to digital converter.

Figure 9:
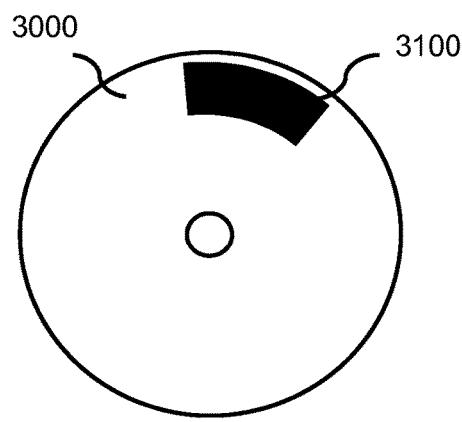
FIG. 9 shows a computer readable medium comprising a computer program product.

FIG. 9 shows a computer readable medium 3000 comprising a computer program product 3100, the computer program product 3100 comprising instructions for causing a processor apparatus to perform an electric power metering method.

The computer program product 3100 may be embodied on the computer readable medium 3000 as physical marks or by means of magnetization of the computer readable medium 3000. However, any other suitable embodiment is conceivable as well. Furthermore, it will be appreciated that, although the computer readable medium 3000 is shown in FIG. 8 as an optical disc, the computer readable medium 3000 may be any suitable computer readable medium, such as a hard disk, solid state memory, flash memory, etc., and may be non-recordable or recordable.

An operating system (OS) is the software that manages the sharing of the resources of a computer and provides programmers with an interface used to access those resources. An operating system processes system data and user input, and responds by allocating and managing tasks and internal system resources as a service to users and programs of the system.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Therefore, many options exist for transferring signals.

Because the apparatus implementing the present invention is, for the most part, composed of electronic components and circuits known to those skilled in the art, circuit details have not been explained in any greater extent than that considered necessary, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Furthermore, although FIG. 1a and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of power meter 100, for example, from computer readable media such as a memory or other media on other computer systems. Such computer readable media may be permanently, removably or remotely coupled to an information processing system such as power meter 100. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, power meter 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device. Also, the units and circuits may be suitably combined in one or more semiconductor devices. For example, analog to digital converter 120, time to frequency domain converter 130, frequency domain correction unit 140, and energy calculation unit 160 may be combined in in one or more semiconductor devices.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electric power meter for measuring electric power, the power meter comprising
   a voltage sample buffer in the electric power meter, the voltage sample buffer configured to receive a sequence of digital voltage samples representing voltage measured by a voltage sensor,
   a current sample buffer in the electric power meter, the current sample buffer configured to receive a sequence of digital current samples representing current measured by a current sensor,
   a frequency domain converter in the electric power meter, the frequency domain converter configured to convert the sequence of digital voltage samples from the time domain to a frequency domain obtaining digital voltage frequency components, and to convert the sequence of digital current samples from the time domain to the frequency domain obtaining digital current frequency components, a frequency domain correction unit in the electric power meter, the frequency domain correction unit configured to correct the voltage frequency components and the current frequency components by multiplying at least one frequency component of the current frequency components and the voltage frequency components with a complex correction factor, the complex correction factor having a non-zero imaginary part, using a complex multiplication unit, obtaining corrected voltage and current frequency components, an energy calculation unit in the electric power meter, the energy calculation unit configured to compute the electric power from the corrected voltage and current frequency components.

2. An electric power meter as in claim 1 comprising an analog-to-digital converter, wherein the analog-to-digital converter is connectable to the voltage sensor and configured to provide digital voltage samples representing voltage measured by the voltage sensor to the voltage sample buffer, and/or the analog-to-digital converter is connectable to the current sensor and configured to provide digital current samples representing current measured by the current sensor to the current sample buffer.

3. An electric power meter as in claim 2, wherein the analog-to-digital converter has at least two input-channels connectable to the voltage sensor and current sensor, the analog-to-digital converter is configured to alternately convert the at least two input-channels to a digital value.

4. An electric power meter as claim 1 comprising exactly one analog-to-digital converter.

5. An electric power meter as in claim 1, wherein the frequency domain correction unit is configured to receive environment information from an electric system connected to the voltage sensor and the current sensor, the frequency domain correction unit comprising a control unit for determining the complex correction factor from the environment information.

6. An electric power meter as in claim 5, wherein
the environment information comprises a temperature measurement from a temperature sensor.

7. An electric power meter as in claim 5, wherein
the environment information comprises a digital current sample representing current measured by the current sensor.

8. An electric power meter as in claim 5, wherein the control unit comprises
a look-up table, the control unit being configured to look-up the complex correction factor under control of the environment information.

9. An electric power meter as in claim 5, wherein the control unit comprises
an interpolation function for computing the complex correction factor from at least the environment information.

10. An electric power meter as in claim 9, wherein the frequency domain correction unit is configured to correct the time delay of the current sensor by multiplying each current frequency component ($f_k f_i$) with a different power of the complex correction factor ($c^k$)*$f_k$.

11. An electric power meter as in claim 1, wherein the frequency domain correction unit is configured to correct multiple frequency components of the voltage frequency components and the current frequency components by multiplying each of the multiple frequency components with one of multiple complex correction factors using the complex multiplication unit.

12. An electric power meter as in claim 1, wherein the current sensor is delayed with a time delay with respect to the voltage sensor, the frequency domain correction unit being configured to correct the time delay of the current sensor by multiplying one or more current frequency components with complex correction factors using a complex multiplication unit.

13. An electric power meter as in claim 1, wherein correction factor corrects amplitude and phase of the frequency component, the complex correction factor having a norm different from 1.

14. An electric power meter as in claim 1, further comprising a first connector for connecting to a first electric wire, a second connector for connecting to a second electric wire and an electric connection configured to electrically connect the first connector to the second connector, the voltage sensor and the current sensor being applied to the electric connection.

15. An electric power meter as in claim 14, wherein
the current sensor comprises any one of: a shunt resistor, a current transformer, and/or a Rogowski coil.

16. An electric power meter as in claim 14, wherein the power meter is configured to measure electric power consumption in a household.

17. An integrated circuit comprising at least one power meter according to claim 14.

18. An electric power metering method for measuring electric power, the power metering method comprising
receiving, in an electric power meter, a sequence of digital voltage samples representing voltage measured by a voltage sensor, receiving, in the electric power meter, a sequence of digital current samples representing current measured by a current sensor, converting, in the electric power meter, the sequence of digital voltage samples from the time domain to a frequency domain obtaining digital voltage frequency components, and converting the sequence of digital current samples from the time domain to the frequency domain obtaining digital current frequency components, correcting, in the electric power meter, the voltage frequency components and the current frequency components by multiplying at least one frequency component of the current frequency components or the voltage frequency components with a complex correction factor, the complex correction factor having a non-zero imaginary part, obtaining corrected voltage and current frequency components, computing, in the electric power meter, the electric power from the corrected voltage and current frequency components.

19. A non-transitory tangible computer readable storage medium having stored thereon a computer program comprising instructions for causing a programmable apparatus to perform a method of electric power metering, the method comprising:
receiving, in an electric power meter, a sequence of digital voltage samples representing voltage measured by a voltage sensor, receiving, in the electric power meter, a sequence of digital current samples representing current measured by a current sensor, converting, in the electric power meter, the sequence of digital voltage samples from the time domain to a frequency domain obtaining digital voltage frequency components, and converting the sequence of digital current samples from the time domain to the frequency domain obtaining digital current frequency components, correcting, in the electric power meter, the voltage frequency components and the current frequency components by multiplying at least one frequency component of the current frequency components or the voltage frequency components with a complex correction factor, the complex correction factor having a non-zero imaginary part, computing, in the electric power meter, the electric power from said corrected voltage and current frequency components.

20. A non-transitory tangible computer readable storage medium comprising data loadable in a programmable apparatus, the data representing instructions executable by the programmable apparatus, said instructions comprising:

one or more receiving instructions for receiving, in an electric power meter, a sequence of digital voltage samples representing voltage measured by a voltage sensor, one or more receiving instructions for receiving, in the electric power meter, a sequence of digital current samples representing current measured by a current sensor, one or more converting instructions for converting, in the electric power meter, the sequence of digital voltage samples from the time domain to a frequency domain obtaining digital voltage frequency components, and for converting the sequence of digital current samples from the time domain to the frequency domain obtaining digital current frequency components, one or more correcting instructions for correcting, in the electric power meter, the voltage frequency components and the current frequency components by multiplying at least one frequency component of the current frequency components or the voltage frequency components with a complex correction factor, the complex correction factor having a non-zero imaginary part, obtaining corrected voltage and current frequency components, one or more computing instructions for computing, in the electric power meter, the electric power from the corrected voltage and current frequency components.

* * * * *